(12) United States Patent
Murakami

(10) Patent No.: US 9,704,791 B2
(45) Date of Patent: Jul. 11, 2017

(54) WIRING BOARD AND ELECTRONIC DEVICE

(71) Applicant: KYOCERA Corporation, Kyoto-shi, Kyoto (JP)

(72) Inventor: Kensaku Murakami, Kyoto (JP)

(73) Assignee: KYOCERA CORPORATION, Kyoto-Shi, Kyoto (JP)

(*) Notice: Subject to any disclaimer, the term of this patent is extended or adjusted under 35 U.S.C. 154(b) by 0 days.

(21) Appl. No.: 14/902,353

(22) PCT Filed: Oct. 23, 2014

(86) PCT No.: PCT/JP2014/078226
§ 371 (c)(1),
(2) Date: Dec. 31, 2015

(87) PCT Pub. No.: WO2015/060387
PCT Pub. Date: Apr. 30, 2015

(65) Prior Publication Data
US 2016/0372407 A1    Dec. 22, 2016

(30) Foreign Application Priority Data

Oct. 23, 2013  (JP) ................. 2013-220260

(51) Int. Cl.
| H01L 23/48 | (2006.01) |
| H01L 23/498 | (2006.01) |
| H05K 3/40 | (2006.01) |
| H01L 23/00 | (2006.01) |
| H01L 33/62 | (2010.01) |
| H05K 3/46 | (2006.01) |

(52) U.S. Cl.
CPC .. *H01L 23/49811* (2013.01); *H01L 23/49805* (2013.01); *H01L 23/49838* (2013.01);
(Continued)

(58) Field of Classification Search
CPC ................................. H01L 23/49811
USPC .......................................... 257/773
See application file for complete search history.

(56) References Cited

U.S. PATENT DOCUMENTS 6,344,609 B1 * 2/2002 Nakano ............ H01L 23/49805
174/351
8,232,479 B2 * 7/2012 Satou .................... H01G 2/065
174/126.1
(Continued)

FOREIGN PATENT DOCUMENTS

| JP | 05-183066 A | 7/1993 |
| JP | 09-008423 A | 1/1997 |

(Continued)

OTHER PUBLICATIONS

International Search Report, PCT/JP2014/078226, Jan. 13, 2015, 1 pg.

(Continued)

*Primary Examiner* — Jami M Valentine
(74) *Attorney, Agent, or Firm* — Volpe and Koenig, P.C.

(57) ABSTRACT

This wiring board is provided with: an insulating base that has a lateral surface having an incision part; an electrode that is provided on the inner surface of the incision part; and a wiring conductor that is provided within the insulating base or on the surface of the insulating base and is electrically connected to the electrode via a connection conductor. The width of the incision part is larger than the depth thereof, and the connection conductor is connected to the electrode at an end of the incision part in the width direction. An electronic device according to the present invention is provided with this wiring board and an electronic component that is mounted to the upper surface of this wiring board.

6 Claims, 8 Drawing Sheets

(52) U.S. Cl.
CPC ............ *H01L 24/05* (2013.01); *H05K 3/403* (2013.01); *H01L 33/62* (2013.01); *H01L 2224/16225* (2013.01); *H01L 2224/48227* (2013.01); *H01L 2924/181* (2013.01); *H05K 3/4629* (2013.01); *H05K 2201/09036* (2013.01); *H05K 2201/0969* (2013.01); *H05K 2201/09145* (2013.01)

(56) References Cited

U.S. PATENT DOCUMENTS

| | | | | |
|---|---|---|---|---|
| 2011/0315439 | A1* | 12/2011 | Nakashima | H01L 23/055 174/260 |
| 2013/0265727 | A1* | 10/2013 | Segawa | H05K 1/183 361/748 |
| 2015/0173190 | A1* | 6/2015 | Murakami | F21V 21/00 362/382 |

FOREIGN PATENT DOCUMENTS

| | | | |
|---|---|---|---|
| JP | 10-093213 | A | 4/1998 |
| JP | 10-163591 | A | 6/1998 |
| WO | 20041001837 | A2 | 12/2003 |

OTHER PUBLICATIONS

Extended European Search Report, European Patent Application No. 14855585.7, Apr. 24, 2017, 7 pgs.

* cited by examiner

… (1,1)

WIRING BOARD AND ELECTRONIC DEVICE

TECHNICAL FIELD

The present invention relates to a wiring board and to an electronic device.

BACKGROUND ART

In a conventional wiring board, a wiring conductor is provided on one of an inner part and a surface of an insulating base, and an electrode is provided connected to the wiring conductor on one of an incision part and an inner face of the incision part, which is provided from a side face to a lower face of the insulating base. In a situation where an electronic device that includes this wiring board is joined to an external circuit board, the electrode of the wiring board is bonded to an electrode pad or the like of the external circuit board through a solder material.

CITATION LIST

Patent Literature

Patent Document 1: Japanese Unexamined Patent Application Publication No. H5-183066A

SUMMARY OF INVENTION

Technical Problem

In recent years, advances have been made in the miniaturization of electronic devices. However, increased length along an edge direction of a board (i.e., width), relative to depth of an incision part (electrode) in the wiring board, is being sought, for example, in order to suppress the degradation of wiring board bonding strength when bonded to an external circuit board by a solder material.

Nevertheless, in a situation where an insulating base configuring the wiring board is made from ceramic, then upon laminating and applying pressure to ceramic green sheets, for example, in manufacturing of the wiring board, deformation may occur causing a central portion of the incision part to protrude toward an inner side of the incision part, as viewed from above. This causes one of line breakage and unusual resistance to occur between the wiring board and the electrode. Furthermore, in a situation where the electronic component is a light-emitting element, there has been a possibility of faulty light emission.

Solution to Problem

A wiring board of the present invention is equipped with an insulating base having a side face that includes an incision part, with an electrode provided on an inner face of the incision part, and with a wiring conductor provided on one of an inner part and a surface of the insulating base, and connected to the electrode via a connection conductor. The incision part is greater in width than in depth. Also, the connection conductor is connected to the electrode at an end portion of the incision part in a width direction.

An electronic device of the present invention includes the above-described wiring board and an electronic component mounted on the wiring board.

Advantageous Effects of Invention

The wiring board of the present invention is equipped with an insulating base having a side face that includes an incision part, with an electrode provided on an inner face of the incision part, and with a wiring conductor provided on one of an inner part and a surface of the insulating base, and connected to the electrode via a connection conductor. The incision part is greater in width than in depth. Also, the connection conductor is connected to the electrode at an end portion of the incision part in the width direction. Thus, the connection conductor and the electrode are connected at a portion where deformation is small, namely the end portion of the incision part in the width direction, despite deformation causing the central portion of the incision part to protrude toward the inner face of the incision part as viewed from above on a ceramic green sheet laminated body in manufacturing of the wiring board. As such, disconnection of the connection conductor and the electrode is made unlikely. Accordingly, effective light emission is produced in a situation where the electronic component is a light-emitting element, without either of line breakage and unusual resistance occurring in wiring conductor and the electrode.

The electronic device of the present invention enables improvements to electrical reliability and electrical performance by having the above-described wiring board.

DESCRIPTION OF EMBODIMENTS

Figure 1A:
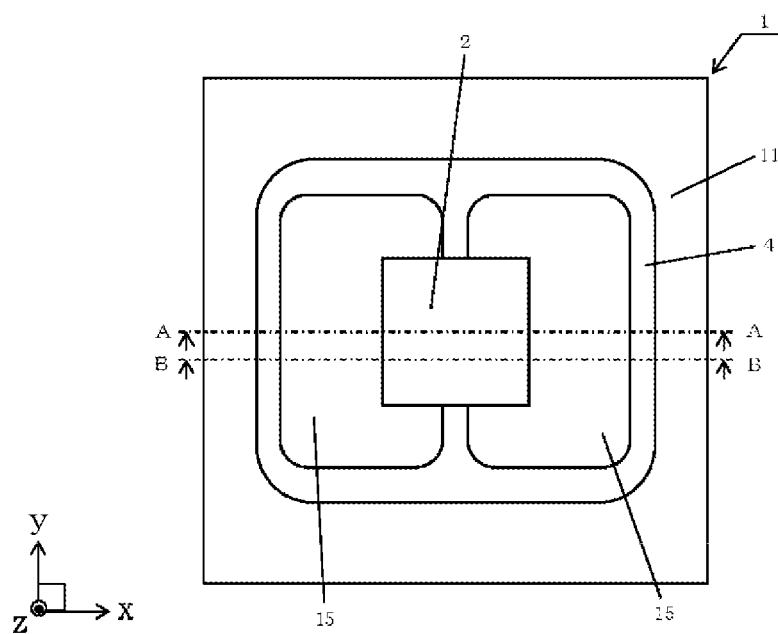
FIG. 1A is a top face view illustrating an electronic device pertaining to a first embodiment of the present invention.
Figure 1B:
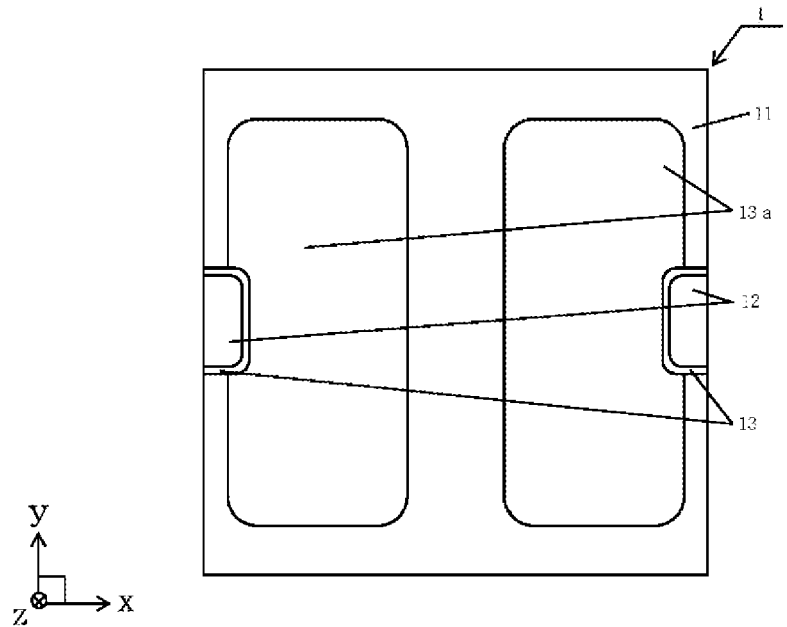
FIG. 1B is a lower face view of FIG. 1A.
Figure 2A:
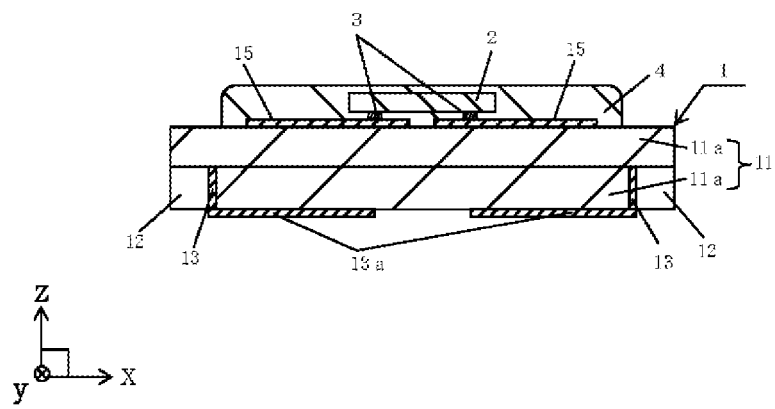
FIG. 2A is a cross-sectional view taken along line A-A of the electronic device illustrated in FIG. 1A.
Figure 2B:
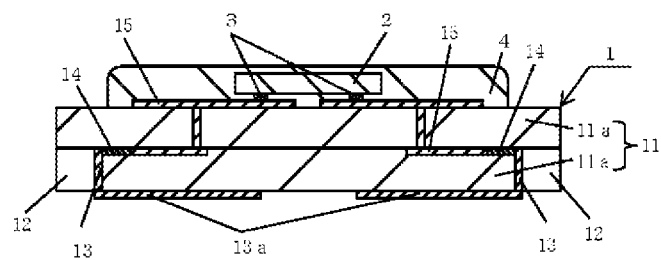
FIG. 2B is a cross-sectional view taken along line B-B of the electronic device illustrated in FIG. 1A.
Figure 2B:
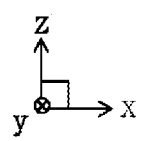

Embodiments of the invention are described as examples, with reference to the accompanying drawings.
First Embodiment
An electronic device according to a first embodiment of the present invention includes a wiring board 1 and an electronic component 2 provided on a top face of the wiring board 1, as illustrated in FIGS. 1A and 1B and FIGS. 2A and 2B. The electronic device is mounted on a circuit board configuring an electronic component module, for example.

The wiring board 1 includes an insulating base 11 having a side face that includes an incision part 12, an electrode 13 provided on an inner face of the incision part 12, and a wiring conductor 15 that is provided on one of an inner part and a surface of the insulating base 11 and is connected to the electrode 13 via a connection conductor 14. The incision part 12 is greater in width than in depth. The connection conductor 14 is connected to the electrode 13 at an end portion of the incision part 12 in a width direction thereof. In FIGS. 1A and 1B to FIGS. 4A and 4B, and in FIGS. 5A and 5B to FIGS. 8A and 8B described later, the electronic device is mounted in an x-y plane in a virtual x-y-z space. In FIGS. 1A and 1B to FIGS. 4A and 4B, and in FIGS. 5A and 5B to FIGS. 8A and 8B described later, the upward direction is a positive direction along a virtual Z axis. Also, in the examples illustrated in FIGS. 1A and 1B to FIGS. 4A and 4B and FIGS. 5A and 5B to FIGS. 8A and 8B described later, the width direction of the incision part 12 is a direction along an outer edge of the insulating base 11 in which the incision part 12 is provided, as viewed from above (i.e., the y direction). The depth direction of the incision part 12 is a direction perpendicular to the outer edge of the insulating base 11 in which the incision part 12 is provided, as viewed from above (i.e., the x direction).

The insulating base 11 is formed from a plurality of insulating layers 11a, has a top face that includes a mounting region for the electronic component 2, and is shaped as a rectangular plate as viewed from above. The insulating base 11 serves as a support body for supporting the electronic component 2. The electronic component 2 is fixedly fastened to the mounting region on a central portion of the top face of the insulating base 11 via an adhesive such as low-melting point solder material, or a conductive resin.

The insulating base 11 may, for example, be made from ceramics, such as an aluminum oxide-based sintered body (i.e., aluminum oxide ceramic), an aluminum nitride-based sintered body, a mullite-based sintered body, or a glass ceramics sintered body.

In a situation where the insulating base 11 is made from an aluminum oxide-based sintered body, for example, the insulating base 11 is manufactured as follows. A suitable organic binder, solvent, and the like are added to and combined with raw material powders of aluminum oxide, silicon oxide, magnesium oxide, calcium oxide, and the like to produce a slurry. The slurry is formed into a sheet using one of a doctor blade method, a calendar roll method, or the like to obtain a ceramic green sheet. After an appropriate time, a suitable punching process is applied to the ceramic green sheet, which is then laminated in plurality and fired at a high temperature (e.g., 1600° C.).

The incision part 12 is provided on a side face of the insulating base 11. In the examples illustrated in FIGS. 1A, 1B, 3A, 3B, 4A, and 4B, the incision part 12 is formed in a rectangular shape with corners having an arc shape as viewed from above. Also, as viewed from above, the incision part 12 may include one of a semi-ovoid shape and a semi-elliptical shape, and may also have a rectangular shape with a plurality of level differences. The incision part 12 has an extended shape along an outer edge direction of the insulating base 11. Also, the incision part 12 is greater in width than in depth. The incision part 12 may also be provided across the insulating base 11 from one main surface to another main surface. As illustrated in the examples of FIGS. 1A and 1B to FIGS. 3A and 3B, the incision part 12 may also be provided across the main surface of the insulating base 11 from a point partially along the side face. The incision part 12, being configured as above, is provided in several ceramic green sheets intended for use in the insulating base 11 using one of laser processing and a punching process using a die and the like, which forms a through-hole that serves as the incision part 12.

The electrode 13 is provided on the inner face of the incision part 12 and is connected to an external electrode 13a on a lower face of the insulating base 11. Providing the electrode 13 on an end portion of the inner face of the incision part 12 is preferable in enabling the connection conductor 14 and the electrode 13 to be reliably connected at a portion where deformation is small, namely the end portion of the incision part 12 in the width direction, despite deformation causing a central portion of the incision part 12 to protrude toward an inside direction of the incision part 12 as viewed from above on a ceramic green sheet laminated body in manufacturing of the wiring board 1. In addition, the electrode 13 may also have an extension on the order of from 0.05 to 0.1 mm in a portion connecting to the connection conductor 14 so as to surround the incision part 12, as viewed from above. The wiring conductor 15 is provided on the surface and on the inner part of the insulating base 11. One end portion of the wiring conductor 15 is guided along the surface of the insulating base 11, and another end portion of the wiring conductor 15 is electrically connected to the electrode 13 via the connection conductor 14. The electrode 13, the external electrode 13a, the connection conductor 14, and the wiring conductor 15 serve to electrically connect the electronic component 2 mounted on the wiring board 1 to an external circuit board. The wiring conductor 15 includes a wiring conductor provided on one of the surface and the inner portion of the insulating base 11, and a through conductor electrically connecting wiring conductors, each positioned above and below, to each other through the insulating layers 11a making up the insulating base 11.

The electrode 13, the external electrode 13a, the connection conductor 14, and the wiring conductor 15 may be made from a metal material such as tungsten (W), molybdenum (Mo), manganese (Mn), silver (Ag), or copper (Cu). For example, in a situation where the insulating base 11 is formed from an aluminum oxide-based sintered body, the following may be performed. A conductor paste, obtained by combining a high-melting point metal powder of tungsten, molybdenum, manganese, and the like with an organic binder, a solvent, and the like, is applied in advance by printing in a predetermined pattern using a screen printing method on the ceramic green sheet intended as the insulating base 11. The paste is fired simultaneously with the ceramic green sheet intended as the insulating base 11, thus forming the above-listed components deposited at predetermined positions on the insulating base 11. In a situation where the wiring conductor 15 is a through conductor, a through-hole is formed in the green sheet by one of a laser process and a punching process using one of a die and punching. The printing method is then used to fill the through-hole with the conductive paste for the wiring conductor 15, thus forming the wiring conductor 15. The electrode 13 is formed by print application of a conductive paste for the electrode 13 to a region intended as the inner face of the through-hole intended as the incision part 12.

Figure 3A:
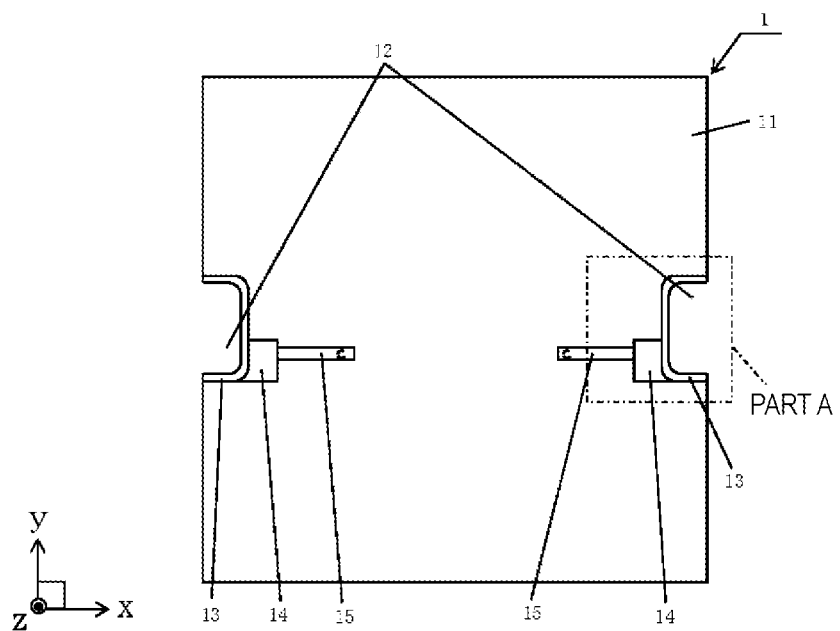
FIG. 3A is a top face perspective view illustrating a connection conductor of a wiring board illustrated in FIG. 1A.
Figure 3B:
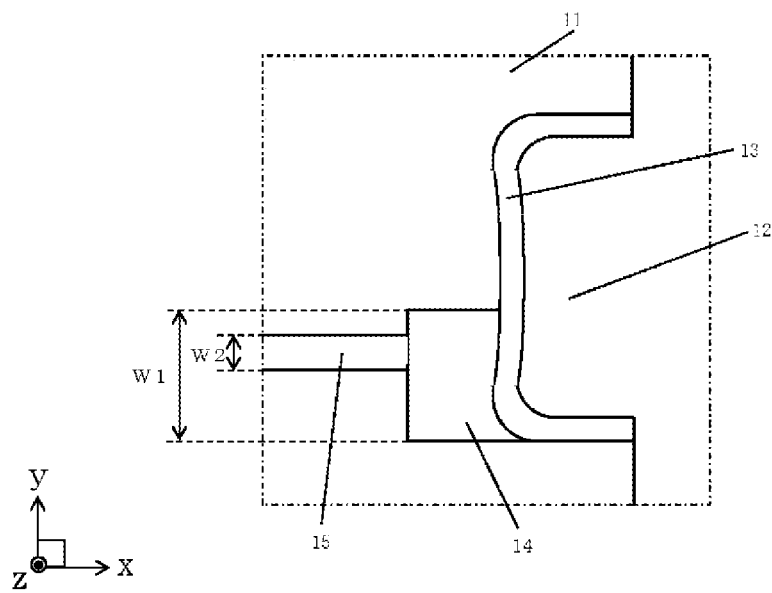
FIG. 3B is a magnified top face perspective view of key portions in part A of FIG. 3A.

As illustrated in the example of FIGS. 3A and 3B, the connection conductor 14 may be wider than the wiring conductor 15. The connection conductor 14 is connected to the electrode 13 at the end portion of the incision part 12 in the width direction. As such, having the connection conductor 14 be wider than the wiring conductor 15 is preferable in that electrical resistance between the wiring conductor 15 and the electrode 13 is reduced. Here, the width W1 of the connection conductor 14 and the width W2 of the wiring conductor 15 have a relationship such that W1≥1.5 W2. This makes for more reliable connection between the connection conductor 14 and the wiring conductor 15, and makes disconnection less likely, at the portion where deformation is small, namely the end portion of the connection conductor 14 in the width direction, despite deformation causing the central portion of the incision part 12 to protrude toward the inside direction of the incision part 12 as viewed from above on the ceramic green sheet laminated body in manufacturing of the wiring board 1. In addition, as illustrated in the examples of FIGS. 3A and 3B, and of later-described FIGS. 7A, 7B, 8A, and 8B, having the connection conductor 14 be wider is preferable in enabling the connection conductor 14 and the electrode 13 to be connected not only at the end portion of the incision part 12 in the width direction, but also in the vicinity of the end portion of the incision part 12 on the central portion side in the width direction, where deformation is comparatively small. As a result, the electrical connection of the electrode 13 and the connection conductor 14, as well as the electrical connection of the connection conductor 14 and the wiring conductor 15, may be further improved.

Figure 4A:
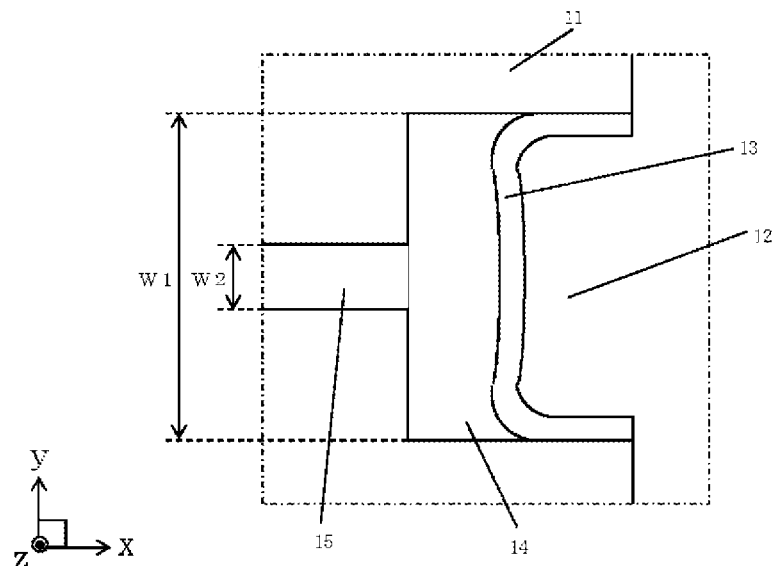
FIGS. 4A and 4B are magnified top face perspective views of key inner portions illustrating a periphery of an incision part in the wiring board, in another example of the first embodiment of the present invention.
Figure 4B:
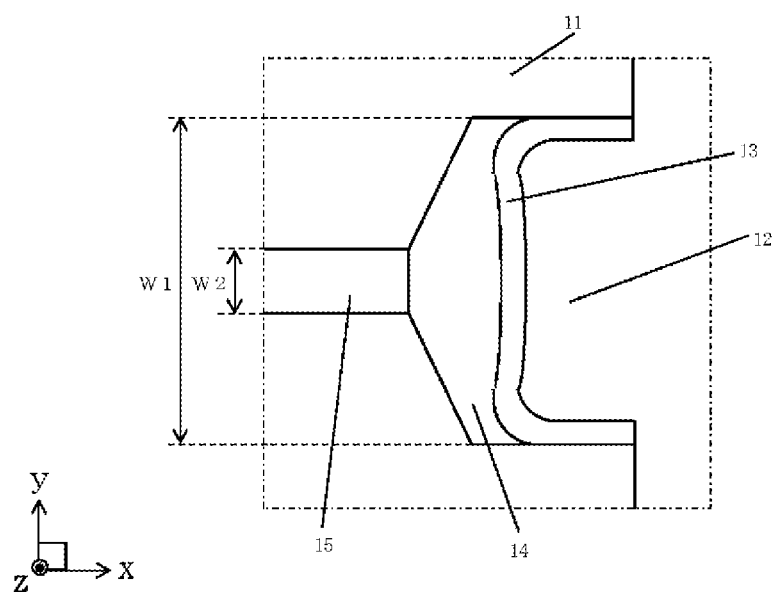

Also, as illustrated in the example of FIGS. 4A and 4B, the electrode 13 may be provided on the end portion of the inner face of the incision part 12. The connection conductor 14 may be equal in width to the electrode 13 at the portion connected to the electrode 13. Furthermore, as illustrated in the example of FIG. 4A, the connection conductor 14 may be equal in width to the wiring conductor 15 and the electrode 13 at the portion of the connection conductor between the wiring conductor 15 and the electrode 13. Furthermore, as illustrated in the example of FIG. 4B, the connection conductor 14 may have a width that gradually grows smaller from a portion connected to the electrode 13 to a portion connected to the wiring conductor 15. As such, the electrode 13 is provided on the end portion of the inner face of the incision part 12, and the connection conductor 14 is equal in width to the electrode 13. Thus, the connection conductor 14 and the electrode 13 are connected at both end portions of the incision part 12 in the width direction, which are portions where deformation is small, despite deformation causing the central portion of the incision part 12 to protrude toward an inside direction of the incision part 12 as viewed from above on the ceramic green sheet laminated body in manufacturing of the wiring board 1. This effectively enables disconnection to be prevented. In addition, given that the connection conductor 14 is wider, the connection conductor 14 and the electrode 13 may be reliably connected not only at the end portion of the incision part 12 in the width direction, but also in the vicinity of the end portion of the incision part 12 on the central portion side in the width direction, where deformation is comparatively small, which is preferable. Also, given that the connection conductor 14 is wider, the electrical resistance in the connection conductor 14 is reduced. Furthermore, having the width of the connection connector 14 gradually grow smaller from the portion connected to the electrode 13 to the portion connected to the wiring conductor 15 is preferable in making dramatic changes in impedance unlikely from the portion connected to the electrode 13 to the portion connected to the wiring conductor 15.

Figure 5A:
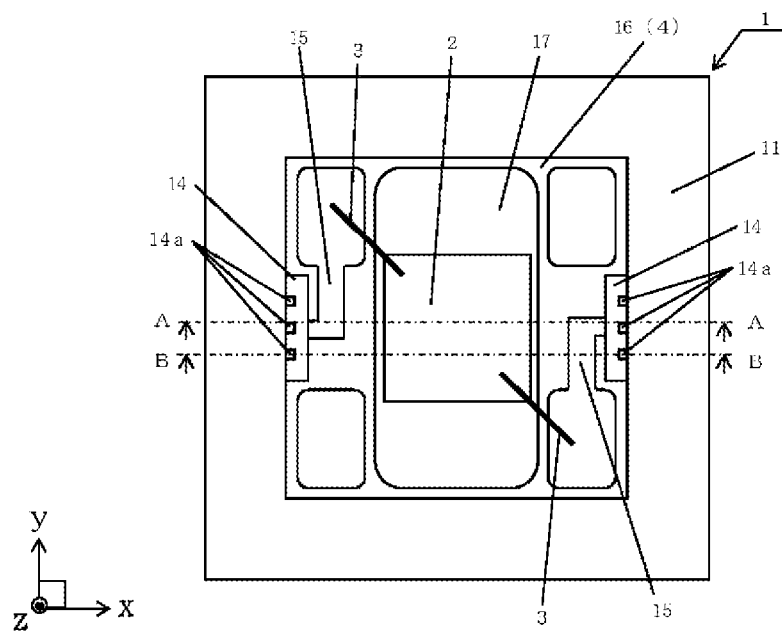
FIG. 5A is a top face view illustrating an electronic device pertaining to a second embodiment of the present invention.

In addition, as illustrated in the examples of FIGS. 4A and 5A, and of later-described FIGS. 7A and 7B, the connection position of the connection conductor 14 and the wiring conductor 15 gains a degree of freedom in a situation where the connection conductor 14 is wider on the wiring conductor 15 side, which is preferable. In these examples, the wiring conductor 15 is connected at the center of the connection conductor 14 in the width direction, as viewed from above.

The length of the connection conductor 14, that is, the distance from an end of the connection conductor 14 on the wiring conductor 15 side to the incision part 12, is preferably not less than 0.2 mm. As a result, the electrical connection of the electrode 13 and the wiring conductor 15 may be further improved.

A plating layer is deposited using an electroplating method on exposed surfaces of the electrode 13, the external electrode 13a, and the wiring conductor 15. The plating layer is formed from a metal having superb corrosion resistance and connectivity with a connecting member 3 such as a bonding wire, which is nickel, copper, gold, or silver. For example, a nickel plating layer having a thickness on the order of from 0.5 to 5 µm and a gold plating layer having a thickness on the order of from 0.1 to 3 µm, and alternatively, a nickel plating layer having a thickness on the order of from 1 to 10 µm and a silver plating layer having a thickness on the order of from 0.1 to 1µ are deposited in the stated order. As a result, this enables effective suppression of corrosion on the electrode 13 and the wiring conductor 15. Also, this enables strengthening of any of the fixing of the wiring conductor 15 and the electronic component 2, the bonding between the wiring conductor 15 and the connecting member 3 that is a bonding wire or similar, and the bonding between the electrode 13 and the external electrode 13a and wiring of the external circuit board. Also, depositing a copper plating layer having a thickness on the order of from 10 to 80 µm over the wiring conductor 15 where the electronic component 2 is to be mounted may also facilitate thermal dissipation of heat from the electronic component 2.

The wiring board 1 may be used to manufacture an electronic device by mounting the electronic component 2 on the top face thereof. The electronic component 2 to be mounted on the wiring board 1 is any of a semiconductor element such as an integrated circuit (IC) chip, or a large-scale integration (LSI) chip, a light-emitting element, a piezoelectric element such as a crystal resonator, or a piezoelectric resonator, and various types of sensors and the like. For example, in a situation where the electronic component 2 is a flip-chip semiconductor element, the semiconductor element is mounted on the wiring board 1 by electrically and mechanically connecting an electrode of the semiconductor element and the wiring conductor 15 via the connecting member 3, which is one of a solder bump, a metal bump, a conductive resin (anisotropic conductive resin or similar) and the like. Also, for example, in a situation where the electronic component 2 is a wire bonded semiconductor element, the semiconductor element is mounted on the wiring board 1 by fixing to the electronic component mounting region by a bonding member, and then electrically connecting the electrode of the semiconductor component and the wiring conductor 15 via the connecting member 3, which is a bonding wire or the like. In addition, the electronic component 2 may be mounted on the wiring board 1 in plurality. Where necessary, a miniature electronic component such as a resistance element, or a capacitive element may also be mounted. Furthermore, where necessary, the electronic component 2 may be sealed by a sealing material 4 made from resin, glass, or the like, and by a lid or the like made from resin, glass, ceramic, metal, or the like.

According to the present embodiment, the wiring board 1 is equipped with the insulating base 11 having the side face that includes the incision part 12, the electrode 13 provided on the inner face of the incision part 12, and the wiring conductor 15 provided on one of the inner part and the surface of the insulating base 11 and connected to the electrode 13 via the connection conductor 14. The incision part 12 is greater in width than in depth. The connection conductor 14 is connected to the electrode 13 at the end portion of the incision part 12 in the width direction. As such, the connection conductor 14 and the electrode 13 are connected at a portion where deformation is small, namely the end portion of the incision part 12 in the width direction, despite deformation causing the central portion of the incision part 12 to protrude toward the inside direction of the incision part 12 as viewed from above on the ceramic green sheet laminated body in manufacturing of the wiring board 1. As such, disconnection is unlikely. Accordingly, effective light emission is produced in a situation where the electronic component 2 is a light-emitting element, without either of unusual resistance and disconnection of the wiring conductor 15 and the electrode 13.

The wiring board 1 of the present invention enables suitable usage of a wiring board 1 in which the thickness of the insulating layers 11a and the thickness of the insulating base 11 are thinner, and provides improved electrical connection on this thinner wiring board 1.

According to the electronic device of the present embodiment, the wiring board 1 is configured as described above, and the electronic component 2 is mounted on the wiring board 1. Thus, this enables improvements in terms of electrical reliability and electrical performance.

Second Embodiment

An electronic device pertaining to a second embodiment of the present invention is described next, with reference to FIGS. 5A and 5B to 8A and 8B.

The electronic device pertaining to the second embodiment of the present invention differs from the electronic device of the first embodiment described above in that, as illustrated in the examples of FIGS. 5A and 5B to FIGS. 8A and 8B, the connection conductor 14 includes a plurality of slits 14a formed from the wiring conductor 15 side toward the incision part 12 side. Furthermore, points of difference include the incision part 12 having a rectangular shape that includes a level difference, and the insulating base 11 including a cavity 16.

According to the wiring board of the second embodiment, the connection conductor 14 includes the slits 14a formed from the wiring conductor 15 side toward the incision part 12 side. As such, despite deformation causing the central portion of the incision part 12 to protrude toward the inside direction of the incision part 12 as viewed from above on the ceramic green sheet laminated body in manufacturing of the wiring board 1, and supposing that disconnection occurs at the central portion of the connection conductor 14 in the width direction as viewed from above, the disconnection is more easily suppressed from spreading outward from the slits 14a, which is preferable. In addition, as illustrated in the examples of FIGS. 5A and 5B to FIGS. 8A and 8B, in a situation where the connection conductor 14 is disposed between the insulating layers 11a, bringing ceramic green sheets into contact with each other at portions of the slits 14a, with the conductive paste for the connection conductor 14 being sandwiched between the insulating layers 11a, distributes stress applied to the conductive paste for the connection conductor 14, while laminating and applying pressure to the ceramic green sheets. As such, the laminating quality of the insulating layers 11a around the incision part 12, as well as the electrical connection between the electrode 13 and the wiring conductor 15, may be improved.

Figure 7A:
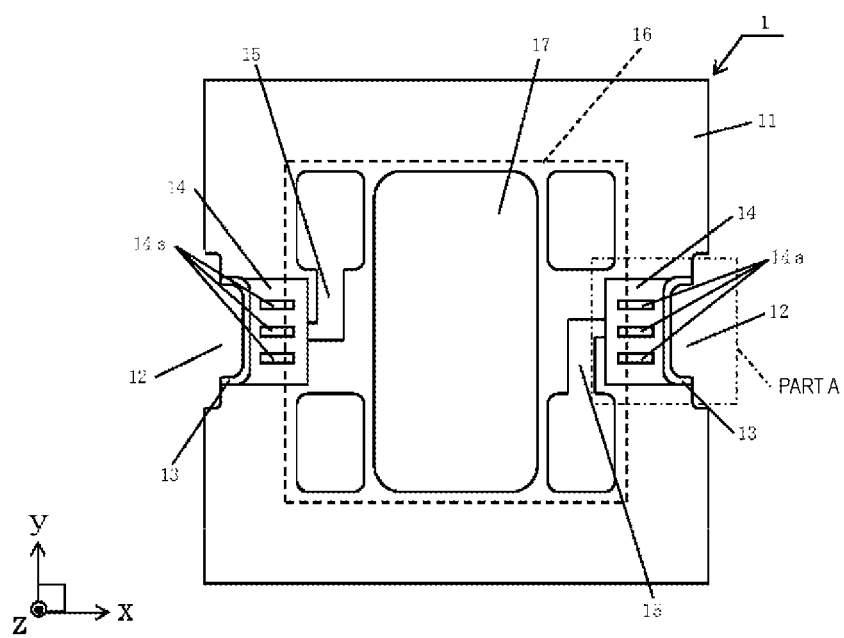
FIG. 7A is a top face perspective view illustrating a connection conductor of a wiring board illustrated in FIG. 5A.
Figure 7B:
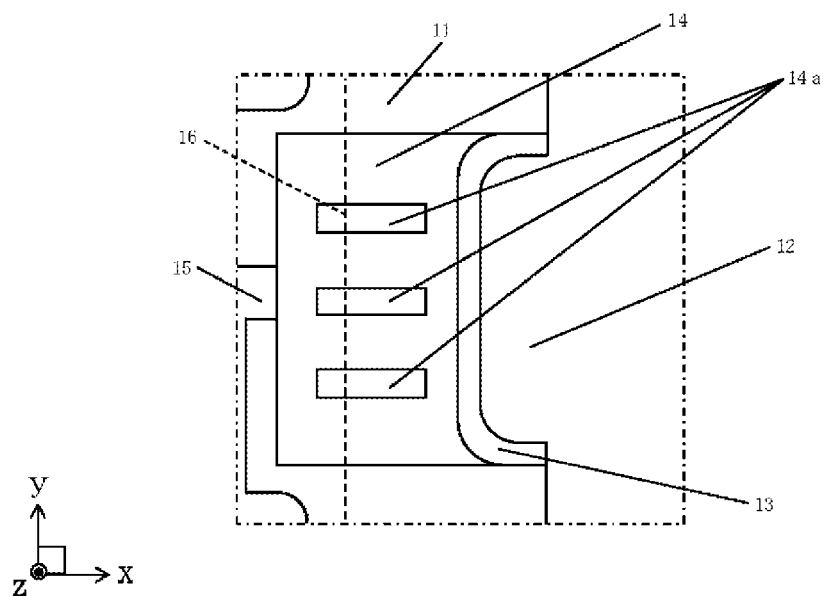
FIG. 7B is a magnified top face perspective view of key portions in part A of FIG. 7A.
Figure 8A:
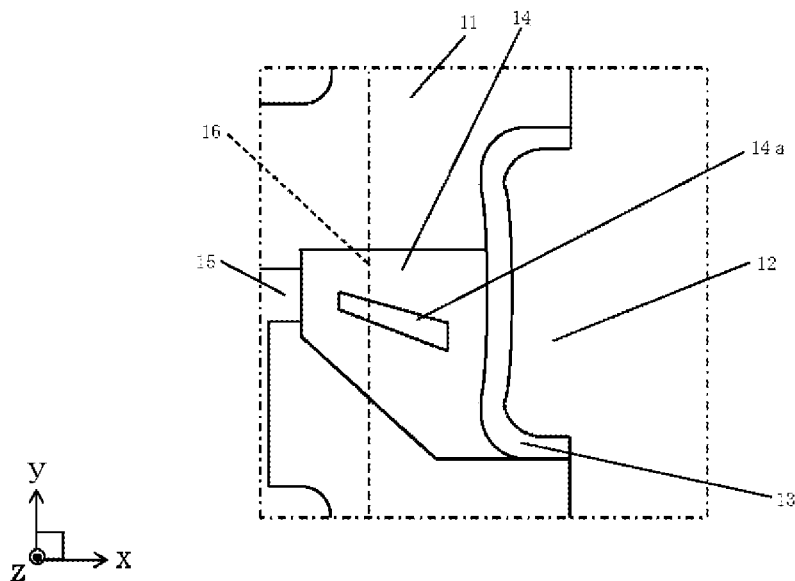
FIGS. 8A and 8B are magnified top face perspective views of key portions illustrating a periphery of an incision part in the wiring board, in another example of the second embodiment of the present invention.
Figure 8B:
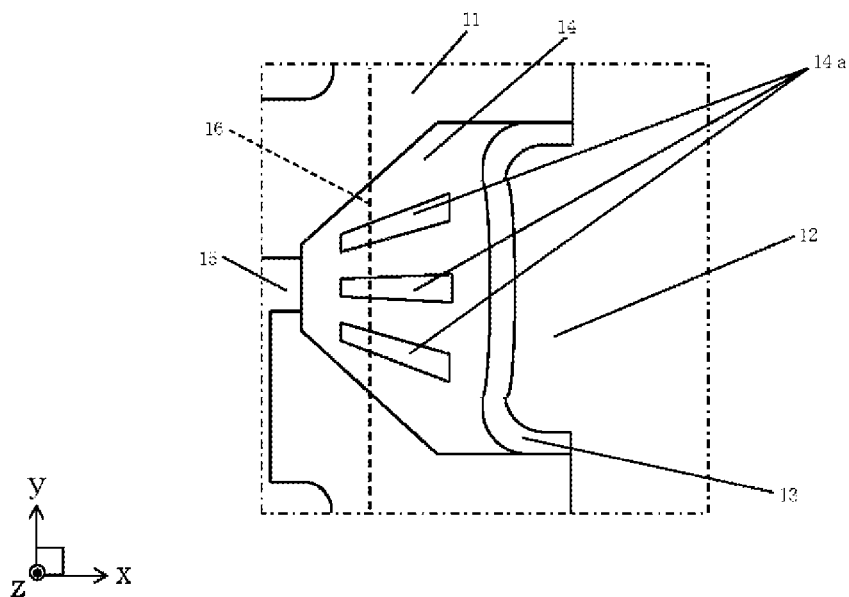

Also as illustrated in the examples of FIGS. 7A, 7B, and 8B, the connection conductor 14 includes the slits 14a in a portion corresponding to the central portion of the incision part 12 in the width direction. As such, disconnection is unlikely to occur closer to the outer side than the slits 14a in the portion corresponding to the central portion of the incision part 12, despite deformation causing the central portion of the incision part 12 to protrude toward the inside direction of the incision part 12 as viewed from above on the ceramic green sheet laminated body in manufacturing of the wiring board 1, which is preferable.

For the wiring board 1 of the second embodiment, in a situation where the connection conductor 14 includes the slits 14a, the width of the connection conductor 14 represents the total width of the connection conductor 14 in a region excluding the slits 14a. The width of the connection conductor 14 between the slits 14a is preferably wider than the width of the wiring conductor 15.

In addition, in a situation where the slits 14a are formed in plurality, as in the examples illustrated in FIGS. 5A, 5B, 7A, and 7B, arranging the slits 14a to be uniform in width makes imbalance of stress during laminating less likely and enables improvements to the laminating of the insulating layers 11a for the ceramic green sheet laminated body in manufacturing of the wiring board 1.

Also, as illustrated in the examples of FIGS. 8A and 8B, the connection conductor 14 may have a width that gradually grows smaller from a portion connected to the electrode 13 toward a portion connected to the wiring conductor 15, similarly to the first embodiment. In such a situation, the width of the slits 14a also preferably gradually grows smaller from the portion connected to the electrode 13 toward the portion connected to the wiring conductor 15.

Figure 5B:
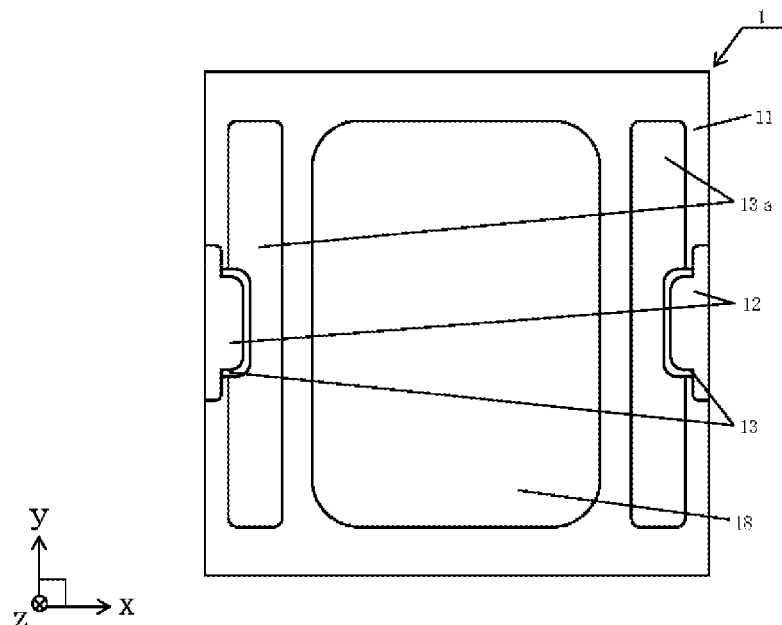
FIG. 5B is a lower face view of FIG. 5A.
Figure 6A:
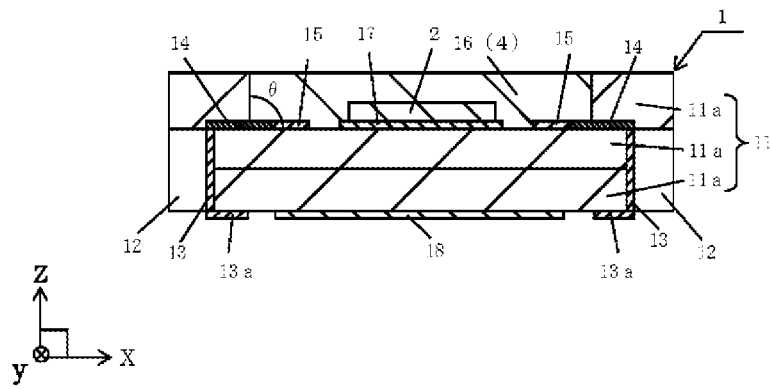
FIG. 6A is a cross-sectional view taken along line A-A of the electronic device illustrated in FIG. 5A.
Figure 6B:
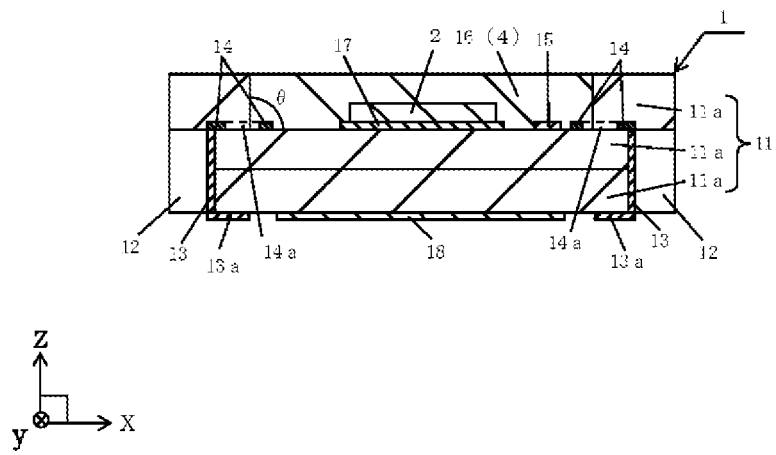
FIG. 6B is a cross-sectional view taken along line B-B of the electronic device illustrated in FIG. 5A.

Here, the insulating base 11 includes the cavity 16 in the top face, as illustrated in the examples of FIGS. 5A and 5B. This cavity 16 may be formed by using one of laser processing and punching processing with a die on the ceramic green sheet, or similar. This forms a through hole intended as the cavity 16 in a plurality of ceramic green sheets, and laminating the ceramic green sheets on a ceramic green sheet in which the through hole is not formed produces the cavity 16. Also, in a situation where the insulating base 11 is thin, the through hole for the cavity 16 is preferably formed after laminating the ceramic green sheets, by precise processing to form the cavity 16 with one of a laser process and a punching process using a die.

In addition, as illustrated in the examples of FIGS. 5A and 5B to 7A and 7B, in comparison to a situation where the connection conductor 14 is formed singly with larger width, forming the connection conductor 14 and the slits 14a so as to extend along a bottom face of the cavity 16 brings the ceramic green sheets into contact with each other at the portions where the slits 14a are formed, with the conductive paste for the connection conductor 14 being sandwiched therebetween, while laminating and applying pressure to the ceramic green sheets intended as the insulating layers 11a. As such, the quality of laminating of the insulating layers 11a is improved at a corner portion where the bottom face and an inner wall face of the cavity 16 meet due to distribution of stress applied to the conductive paste for the connection conductor 14, resulting in the wiring board 1 being superbly airtight. Also, in comparison to a situation where the wiring conductor 15 is formed singly with small width, disconnection of the wiring conductor 15 is constrained at the corner portion where the bottom face and the inner wall face of the cavity 16 meet while laminating and applying pressure to the ceramic green sheets intended as the insulating layers 11a. Thus, the electrical connection of the electrode 13 and the wiring conductor 15 may be improved.

In a situation where the cavity 16 is a space for mounting a light-emitting element, an angle θ between an inner side wall of the cavity 16 and the bottom face of the cavity 16 is obtuse. Specifically, an angle of from 110 to 145 degrees is preferable. Having the angle θ be within this range simplifies the stable and efficient formation of the through hole intended as the cavity 16 by punching processing of the inner side face, and facilitates miniaturization of a light-emitting device using the wiring board 1. Also, the light-emitting element is able to usefully emit light toward the exterior. This cavity 16, including the inner side face at the angle θ, is formed by punching the ceramic green sheets using a punching die set with a large clearance between punch diameters and dice hole diameters. That is, the clearance of the dice hole diameters with respect to the punch diameters is set larger in the punching die. As such, during the punching of the ceramic green sheets from one main surface toward another main surface, the green sheets experience shearing from an edge of a contact face with the punch toward an edge of a contact face with the dice holes, thus forming the through-hole with a diameter that grows wider from the one main surface to the other main surface. Here, the angle of the inner side face of the through hole formed in the ceramic green sheets is adjustable by setting the clearance of the punch diameters and the dice hole diameters in accordance with the thickness of the ceramic green sheets and the like. This punching method is highly productive, given that the method enables the angle θ between the inner side face of the cavity 16 and the bottom face of the cavity 16 to be set to a desired angle using the punching only.

In addition, the clearance between the punch diameters and the dice hole diameters may be small such that the through hole is formed by processing with the punching die with the angle θ being approximately 90 degrees. Afterward, the through hole may be formed with a shape widening at the angle θ from the one main surface to the other main surface, as described above, by pressing a mold shaped as one of a truncated cone and a truncated pyramid to the inner side face of the through hole. In such a situation, the angle θ between the inner side face of the cavity 16 and the bottom face of the cavity 16 is more precisely adjustable.

In a situation where the wiring board 1 includes, for example, the insulating base 11 having a top face that includes the cavity 16 with a light-emitting element mounted thereon, the wiring board 1 may also be provided with a reflective layer for reflecting light emitted by the light-emitting element on the inner wall face of the cavity 16. The reflective layer includes, for example, a metal conductor layer provided on the inside wall face of the cavity 16, and a plating layer deposited on the metal conductor layer. The metal conductor layer may be formed using similar materials and methods as the electrode 13 and the wiring conductor 15.

For example, in a situation where the light-emitting element is mounted on the wiring board 1, depositing a silver plating layer on an outermost surface of the metal conductor layer and depositing a gold plating layer on outermost surfaces of the electrode 13, the external electrode 13a, and the wiring conductor 15 is preferable. This is because the gold plating layer has superb bonding performance with the electronic component 2, the connecting member 3, and wiring of the external circuit board, in comparison to the silver plating layer. The silver plating layer, however, has high reflectivity with respect to light, in comparison to the gold plating layer. Also, an alloy plating layer of gold and silver may be deposited on the wiring conductor 15 and on the outermost surface of the metal conductor layer. For example, an alloy plating layer of gold and silver as a complete solid solution may be used.

The present invention is not limited to the above-described embodiments. Various modified examples are also applicable. In the above-described examples, the incision part 12, the electrode 13, and the external electrode 13a are provided individually on each of two opposite sides of the insulating base 11. However, the incision part 12, the electrode 13, and the external electrode 13a may also be provided at each of four edges of the insulating base 11, and the incision part 12, the electrode 13, and the external electrode 13a may each be provided in plurality on each edge of the wiring board 1.

In addition, as illustrated in the examples of FIGS. 5A and 5B, the wiring board 1 may also include conductors other than wiring, such as one of an electronic component mounting layer 17, a central terminal 18, and the like. For example, these conductors may be manufactured using similar materials and methods as the electrode 13, the external electrode 13a, and the wiring conductor 15 described above, and a plating layer may be deposited on exposed surfaces thereof similarly to the electrode 13 and the wiring conductor 15. The electronic component mounting layer 17 is, for example, used for mounting the electronic component 2. The central terminal 18 is, for example, used for bonding with an external circuit board, similarly to the electrode 13.

Also, in the above-described examples, the electrode 13 extends along a lower face side of the insulating base 11. However, the electrode 13 may also extend along a top face side of the insulating base 11. In such a situation, the external electrode 13a may be joined to the external circuit board at the top face of the wiring board 1. As such, heat dispersion performance of the wiring board 1 may be improved by joining a member having a higher rate of thermal conductivity than the insulating base 11 over the entirety of the lower face side of the wiring board 1. The material having a higher rate of thermal conductivity than the insulating base 11 is, for example, a metal material such as copper (Cu), copper-tungsten (Cu—W), or aluminum (Al). Also, in a situation where the insulating base 11 is an aluminum oxide-based sintered body, an insulating material made from an aluminum nitride-based sintered body may also be used.

In addition, the wiring board 1 may also be one of the following. A through hole may be formed in the insulating base 11, and a metal member having heat dissipation performance that is superior to the insulating base 11 on which the electronic component 2 is mounted is fitted and joined to the insulating base 11 to form the wiring board 1. Alternatively, the metal member having heat dissipation performance that is superior to the insulating base 11 is embedded into the insulating base 11 in a region overlapping the region where the electronic component 2 is mounted, as viewed from above, to form the wiring board 1.

Also, in the above-described examples, only one of the electronic component 2 is mounted on the wiring board 1. However, the electronic component 2 may also be mounted in plurality on the wiring board 1.

In addition, the wiring board 1 may also be manufactured by taking multiple pieces of wiring board from a single piece of wiring board.

The invention claimed is:
1. A wiring board, comprising:
an insulating base comprising a side face that includes an incision part;
an electrode provided on an inner face of the incision part; and
a wiring conductor provided on one of an inner part and a surface of the insulating base, and connected to the electrode via a connection conductor,
the incision part being greater in width than in depth, and
the connection conductor being connected to the electrode at an end portion of the incision part in a width direction.

2. The wiring board according to claim 1, wherein the connection conductor is wider than the wiring conductor.

3. The wiring board according to claim 1, wherein
the electrode is provided on an end portion of an inner face of the incision part, and
the connection conductor is equal in width to the electrode.

4. The wiring board according to claim 1, wherein the connection conductor gradually grows smaller in width from a portion connected to the electrode toward a portion connected to the wiring conductor.

5. The wiring board according to claim 1, wherein the connection conductor includes a slit formed from a side of the wiring conductor toward a side of the incision part.

6. An electronic device, comprising:
the wiring board described in claim 1, and
an electronic component mounted on the wiring board.

* * * * *